(12) United States Patent
Yang et al.

(10) Patent No.: US 7,544,966 B2
(45) Date of Patent: Jun. 9, 2009

(54) THREE-TERMINAL ELECTRICAL BISTABLE DEVICES

(75) Inventors: Yang Yang, Los Angeles, CA (US); Liping Ma, Los Angeles, CA (US); Jun He, Shanghai (CN)

(73) Assignee: The Regents of the University of California, Oakland, CA (US)

( * ) Notice: Subject to any disclaimer, the term of this patent is extended or adjusted under 35 U.S.C. 154(b) by 49 days.

(21) Appl. No.: 10/581,797

(22) PCT Filed: Dec. 1, 2004

(86) PCT No.: PCT/US2004/040368

§ 371 (c)(1),
(2), (4) Date: Jun. 2, 2006

(87) PCT Pub. No.: WO2005/086627

PCT Pub. Date: Sep. 22, 2005

(65) Prior Publication Data

US 2007/0164272 A1 Jul. 19, 2007

Related U.S. Application Data

(60) Provisional application No. 60/527,041, filed on Dec. 3, 2003.

(51) Int. Cl.
*H01L 35/24* (2006.01)
*H01L 21/00* (2006.01)
*G09G 3/36* (2006.01)

(52) U.S. Cl. .................. 257/40; 257/642; 257/759; 257/E39.007; 257/E45.002; 257/E51.01; 438/82; 438/725; 438/780; 345/81; 345/97; 345/204; 345/206

(58) Field of Classification Search .................. 257/40, 257/642, 759, E39.007, E45.002, E51.001, 257/E51.003, E51.01, E51.011, E51.002; 438/82, 725, 780; 345/81, 97, 204, 206
See application file for complete search history.

(56) References Cited

U.S. PATENT DOCUMENTS 3,719,933 A 3/1973 Wakabayashi et al.

(Continued)

FOREIGN PATENT DOCUMENTS

WO   WO 01/71814 A1   9/2001

(Continued)

OTHER PUBLICATIONS

K. Takimoto, H. Kawade, E. Kishi, K. Yano, K. Sakal, K. Hatanaka, K. Eguchi, and T. Nakagirl, Appl. Phys. Lett., 61, 3032 (1992).

(Continued)

*Primary Examiner*—Long K Tran
(74) *Attorney, Agent, or Firm*—Venable LLP; Henry J. Daley

(57) ABSTRACT

A three terminal electrical bistable device that includes a tri-layer composed of an electrically conductive mixed layer sandwiched between two layers of low conductivity organic material that is interposed between a top electrode and a bottom electrode. The conducting mixed layer serves as the middle electrode. The device includes two memory cells composed of electrode/organic layer/mixed layer, where the interfaces between the electrically conductive mixed layer and the low conductivity organic layer exhibit bistable behavior.

23 Claims, 8 Drawing Sheets

(a)

(b)

U.S. PATENT DOCUMENTS

| | | | |
|---|---|---|---|
| 3,833,894 | A | 9/1974 | Aviram et al. |
| 4,144,418 | A | 3/1979 | Girard et al. |
| 4,371,883 | A | 2/1983 | Potember et al. |
| 4,507,672 | A | 3/1985 | Potember et al. |
| 4,652,894 | A | 3/1987 | Potember et al. |
| 4,663,270 | A | 5/1987 | Potember et al. |
| 4,987,023 | A | 1/1991 | Sato et al. |
| 5,075,738 | A | 12/1991 | Matsuda et al. |
| 5,136,212 | A | 8/1992 | Eguchi et al. |
| 5,238,607 | A | 8/1993 | Herron et al. |
| 5,543,631 | A | 8/1996 | Weinberger |
| 5,563,424 | A | 10/1996 | Yang et al. |
| 5,569,565 | A | 10/1996 | Kawakami et al. |
| 5,610,898 | A | 3/1997 | Takimoto et al. |
| 5,761,115 | A | 6/1998 | Kozicki et al. |
| 6,015,631 | A | 1/2000 | Park |
| 6,055,180 | A | 4/2000 | Gudesen et al. |
| 6,122,031 | A | 9/2000 | Terada et al. |
| 6,208,553 | B1 | 3/2001 | Gryko et al. |
| 6,229,047 | B1 | 5/2001 | Glaser et al. |
| 6,600,473 | B1 | 7/2003 | Kobayashi et al. |
| 6,631,085 | B2 | 10/2003 | Kleveland et al. |
| 6,774,880 | B2 | 8/2004 | Kobayashi |
| 6,828,685 | B2 | 12/2004 | Stasiak |
| 6,852,555 | B1 | 2/2005 | Roman et al. |
| 6,950,331 | B2 | 9/2005 | Yang et al. |
| 2002/0010261 | A1 | 1/2002 | Callahan et al. |
| 2002/0031602 | A1 | 3/2002 | Zhang |
| 2002/0163828 | A1 | 11/2002 | Krieger et al. |
| 2002/0163831 | A1 | 11/2002 | Krieger et al. |
| 2002/0195600 | A1 | 12/2002 | Leuschner |
| 2003/0053350 | A1 | 3/2003 | Krieger et al. |
| 2003/0063362 | A1 | 4/2003 | Demir et al. |
| 2003/0155602 | A1 | 8/2003 | Krieger et al. |
| 2003/0173612 | A1 | 9/2003 | Krieger et al. |
| 2003/0178667 | A1 | 9/2003 | Krieger et al. |
| 2003/0179633 | A1 | 9/2003 | Krieger et al. |
| 2004/0026714 | A1 | 2/2004 | Krieger et al. |
| 2004/0159835 | A1 | 8/2004 | Krieger et al. |
| 2004/0160801 | A1 | 8/2004 | Krieger et al. |
| 2004/0246768 | A1 | 12/2004 | Krieger et al. |
| 2005/0111071 | A1 | 5/2005 | Kojima et al. |
| 2006/0134317 | A1* | 6/2006 | Yang et al. ............. 427/78 |

FOREIGN PATENT DOCUMENTS

| | | |
|---|---|---|
| WO | WO 02/37500 A1 | 5/2002 |
| WO | WO 02/091496 A2 | 11/2002 |
| WO | WO 2004/064074 | 7/2004 |

OTHER PUBLICATIONS

Yu. G. Kriger, N.F. Yudanov, I.K. Igumenov, and S.B. Vashchenko, J. Struct. Chem. 34, 966(1993).

R.S. Potember and T.O. Poehler, Appl. Phys. Lett., 34,405 (1979).

H.J. Gao, K. Sohlberg, Z.Q. Xue, H.Y. Chen, S.M. Hou, L.P. Ma, X.W. Fang, X.W. Fang, S.J. Pang, and S.J. Pennycook, Phys. Rew. Lett. 84, 1780 (2000).

L.P. Ma, J. Liu and Y. Yang, Appl. Phys. Lett. 80, 2997 (2002).

L.P. Ma, J. Liu, S. Pyo, and Y. Yang, Appl. Phys. Lett. 80, 362 (2002).

L.P. Ma, S.M. Pyo, J. Ouyang, Q. Xu and Y. Yang. Appl. Phys. Lett. 82, 1419 (2003).

A. Bandyopadhyay and A.J. Pal, Appl. Phys. Lett. 82, 1215 (2003).

H.S. Majumdar, A. Bandyopadyay, A. Bolognesl, and A.J. Pal, J. Appl. Phys. 91, 2433 (2002).

D.M. Taylor and C. A. Mills, J. Appl. Phys. 90, 306 (2001).

The Electrochemical Society —Current Affairs —Abstracts of "Recent News" Papers, Presented at Electronics Division Semiconductor Symposia, Los Angeles, CA (1962).

Ovshinsky, S.R., "Localized States in the Gap of Amorphous Semiconductors", Phys. Rev. Lett., vol. 36 (No. 24), Jun. 14, 1976, pp. 1469-1472.

Hovel, H.J. and J.J. Urgell, "Switching and Memory Characteristics of ZnSe —Ge Heterojunctions", J. Appl. Phys. 42, 5076 (1971).

Kumai, R., Y. Okimoto and Y. Tokura, "Current-Induced Insulator-Metal Transition and Pattern Formation in an Organic Charge-Transfer Complex", Science 284, 1645 (1999).

Garnier, F., R. Hajlaoui, A. Yassar and P. Shirakawa, "All-Polymer Field-Effect Transistor Realized by Printing Techniques", Science 265, 1684 (1994).

Hide, F., M.A. Diaz-Garcia, B.J. Schwartz, M.R.A. Andersson, Q. Pei and A.J. Heeger, Science 273, 1833 (1996).

Fujita, W. and K. Awaga, "Room-Temperature Magnetic Bistability in Organic Radical Crystals", Science, vol. 286 p. 261 (1999).

Burroughes, J.H., D.D.C. Bradley, A.R. Brown, R.N. Marks, K. Mackey, R.H. Friend, P.L. Burn and A.B. Holmes, "Light-Emitting Diodes Based on Conjugated Polymers", Nature, vol. 347, p. 539 (1990).

Yamada, T., D. Zou, H. Jeong, Y. Akaki and T. Tsutsui, "Recoverable Degradation and Internal Field Forming Process Accompanied by the Orientation of Dipoles in Organic Light Emitting Diodes", Synthetic Metals, 111-112, 237 (2000).

Liu, J., Y. Shi, L.P. MA and Y. Yang, "Device Performance and Polymer Morphology in Polymer Light Emitting Diodes: The Control of Device Electrical Properties and Metal/Polymer Contact", J. Appl. Phys. 88, 605 (2000).

Hamada, Y., C. Adachi, T. Tsutsui and S. Saito, "Blue-Light-Emitting Organic Electroluminescent Devices with Oxadiazole Dimer Dyes as an Emitter", Jpn. J. Appl. Phys. 31, 1812 (1992).

Silva, et al., Bistable Switching And Memory Devices; Journal of non-Crystalline Solids; (1970) oo, 316-333 No. Holland Publishing Co., Amsterdam.

Bozano, et al; Mechanism for Bistability in Organic Memory Elements; Applied Physics Letters, (2004); vol. 84, No. 4, pp. 607-609; 2004 American Institute of Physics.

Hua, et al.; New Organic Bistable Films for Ultrafast Electric Memories; Applied Surface Science, 169-170 (20010 pp. 447-451, Elsevier Science B.V..

Beinhoff, et al., Poybiphenymethylenes: New Polymers for Bistable Organic Switches; Polymeric Materials: Science and Engineering 90, (2004) 211, 212, U.S..

Sezi, et al.; Organic Materials for High-Density NonVolatile Memory Applications; Proc. IEEE Int. Elec. Dev. Meeting; (2003); Germany.

Kevorkian, et al.; bistable Switching in Organic Thin Films; Discussions of the Faraday Society, 51, (1971) pp. 139-142; U.S..

Pei, Qibing et al., Polymer Light-Emitting Electrochemical Cells, Science, New Series, vol. 269, No. 5227 (Aug. 25, 1995), pp. 1086-1088.

Kolega et al., Langmiur 1998, vol. 14, p. 5469-5478.

Schlaf et al., "Photoemission Spectrocscopy of LiF Coated Al and Pt Electrodes", Journal of Applied Physics, vol. 84, No. 12, pp. 6729-6736, (1998).

Beeler, F., O.K. Andersen and M. Scheffler", Theoretical Evidence for Low-Spin Ground States of Early Interstitial and Late Substitutional 3d Transition-Metal Ions in Silicon", Phys. Rew. Lett. 55, 1498 (1985).

Boyd, G.D., J. Cheng and P.D.T. Ngo, "Liquid-Crystal Orientational Bistability and Nematic Storage Effects", Appl. Phys., Lett. 36, 556 (1980).

Brown, W.D. and J.E. Brewer, "Nonvolatile Semiconductor Memory Technology", IEEE Press, New York (1998).

Chen, J., W. Wang, M.A. Reed, A.M. Rawlett, D.W. Price and J.M. Tour, "Room-Temperature Negative Differential Resistance in Nanoscale Molecular Junction", Appl. Phys. Lett. 77, 1224 (2000).

Dewald, J.F., A.D. Pearson, W.R. Northover and W.F. Peck, Jr., "Semi-Conducting Glasses", Electrochem. Soc., 109 243c (1962).

Faltermeier, C., C. Goldberg, M. Jones, A. Upham, D. Manger, G. Peterson, J. Lau, A.E. Kaloyeros, B. Arkles, and A. Paranjpe, "Barrier Properties of Titanium Nutrude fukms Grown by Low Temperature Chemical Vapoer Deposition from Titanium Tetraoidide", J. Electrochemical Society, 144, 1002 (1997).

Gruler, H. and L. Cheung, "Dielectric Alignment in an Electrically Conducting Nematic Liquid Crystal", J. Appl. Phys. 46, 5097 (1975).

Istratov, A.A. and E.R. Weber, "Physics of Copper in Silicon", J. Electrochemical Society, 149, G21 (2002).

Istratov, A.A., C. Flink, H. Hieslmair, E.R. Weber and T. Heiser, "Intrinsic Diffusion Coefficient of Interstitial Copper in Silicon", Phys. Rev. Lett. 81, 1243 (1998).

Istratov, A.A., C. Flink, H. Hieslmair, S.A. McHugo and E.R. Weber, "Diffusion, Solubility and Gettering of Copper in Silicon", Materials Science and Engineering Technology B, 72, 99 (2000).

Kaloyeros, A.E. and E. Eisenbraun, "Ultrathin Diffusion Barriers/Liners for Gigascale Copper Metallization", Annual Rev. Materials Science, 30, 363 (2000).

Krishnamoorthy, A., K. Chanda, S.P. Murarka, G. Ramanath and J.G. Ryan, "Self-Assembled Near-Zero-Thickness Molecular Layers as Diffusion Barriers for Cu Metallization", Appl. Phys. Lett. 78, 2467 (2001).

Lane, M.W., E.G. Liniger and J.R. Lloyd, "Relationship Between Interfacial Adhesion and Electromigration in Cu Metallization", J. Appl. Phys. 93, 1417 (2003).

Lee, K.L., C.K. Hu and K.N. Tu, "In-Situ Scanning Electron Microscope Comparison Studies on Electromigration of Cu and Cu(Sn) Alloys for Advanced Chip Interconnects", J. Appl. Phys. 78, 4428-4437 (1995).

Loke, A.L.S., J.T. Wetzel, P.H. Townsend, T. Tanabe, R.N. Vrtis, M.P. Zussman, D. Kumar, C. Ryu and S.S. Wong, "Kinetics of Copper Drift in Low-Kappa Polymer Interlevel Dielectrics", IEEE Transactions on Electron Devices 46, 2178 (1999).

Ma, L.P., J. Liu, S.M. Pyo, Q.F. Xu and Y. Yang, "Organic Bistable Devices", Mol. Cryst. Liq. Cryst. 378, 185 (2002).

Ma, L.P., W.J. Yang, S.S. Xie and S.J. Pang, "Ultrahigh Density Data Storage from Local Polymerization by a Scanning Tunneling Microscope", Appl. Phys. Lett. 73, 3303 (1998).

McBrayer, J.D., R.M. Swanson and T.W. Sigmon, "Diffusion of Metals in Silicon Dioxide", J. Electrochem. Soc. 133, 1242 (1986).

Nakayama, K., K. Kojima, Y. Imai, T. Kasai, S. Fukushima, A. Kitagawa, M. Kumeda, Y. Kakimoto and M. Suzuki, "Nonvolatile Memory Based on Phase Change in Se-Sb-Te Glass", J. J. Appl. Phys., Part 1, 42 (2A), 404 (2003).

Ostraat, M.L., J.W. De Blauwe, M.L. Green, L.D. Bell, M.L. Brongerma, J.R. Casperson, C. Flagan and H.A. Atwater,, "Synthesis and Characterization of Aerosol Silicon Nanocrystal Nonvolatile Floating-Gate Memory Devices", Appl. Phys. Lett. 79, 433 (2001).

Patel, J.S., "Room-Temperature Switching Behavior of Ferroelectric Liquid Crystals in Thin Cells," Appl. Phys. Lett. 47, 1277 (1985).

Rosenberg, R., D.C. Edelstein, C.K. Hu, and K.P. Rodbell, "Copper Metallization for High Performance Silicon Technology", Annual Rev. Materials Science, 30, 229 (2000).

Segui, Y., Ai Bui and H. Carchano, "Switching in Polystyrene Films: Transition from On to Off State", J. Appl. Phys. 47, 140 (1976).

Sprang, H.A. van, and J.L.M. van de Venne, "Influence of the Surface Interaction on Threshold Values in the Cholestericnematic Phase Transition", J. Appl. Phys. 57, 175 (1985).

Wang, M.T., Y.C. Lin, and M.C. Chen, "Barrier Properties of Very Thin Ta and TaN layers Against Copper Diffusion", J. Electrochemical Society, 145, 2538 (1998).

Yang, K.H., T.C. Chieu and S. Osofsky, "Depolarization Field and Ionic Effects on the Bistability of Surface-Stabilized Ferroelectric Liquid-Crystal Devices", Appl. Phys. Lett. 55, 125 (1989).

Bachtold, Adrian et al., "Logic Circuits with Carbon Nanotube Transistors", Science, vol. 294, Nov. 9, 2001, pp. 1317-1320.

Duan, Xiangfeng et al., "Indium Phosphide Nanowires as Building Blocks for Nanoscale Electronic and Optoelectronic Devices", Nature, vol. 49, Jan. 4, 2001, pp. 66-69.

Gudiksen, Mark S. et al., "Growth of Nanowire Superlattice Structures for Nanoscale Photonics and Electronics", Nature, vol. 415, Feb. 7, 2002, pp. 617-620.

Huynh, Wendy U. et al., "Hybrid Nanorod-Polymer Solar Cells", Science, vol. 295, Mar. 29, 2002, pp. 2425-2427.

Adams, David M. et al., "Charge Transfer on the Nanoscale: Current Status", J. Phys. Chem. B., 2003, vol. 107, No. 28, pp. 6668-6697.

Kamat, Prashant V. et al., "Electrochemical Modulation of Fluorophore Emission on a Nanostructured Gold Film", Angew. Chem. Int. Ed. 2002, vol. 41, No. 15, pp. 2764-2767.

Chen, Shaowei et al., "Gold Nanoelectrodes of Varied Size: Transition to Molecule-Like Charging", Science, vol. 280, Jun. 26, 1998, pp. 2098-2101.

Wuelfing, W. Peter et al., "Electronic Conductivity of Solid-State, Mixed-Valent, Monolayer-Protected Au Cluster", J. Am. Chem. Soc. 2000, vol. 122, No. 46, pp. 11465-11472.

Ouyang, Jianyong et al., "Programmable Polymer Thin Film and Non-Volatile Memory Device", Nature Publishing Group, Nature Materials, vol. 3, Dec. 2004, pp. 918-922.

Hostetler, Michael J. et al., "Alkanethiolate Gold Cluster Molecules with Core Diameters from 1.5 to 5.2 nm: Core and Monolayer Properties as a Function of Core Size", Langmuir, 1998, vol. 14, No. 1, pp. 17-30.

Ouyang, Jianyong et al., "Electric-Field-Induced Charge Transfer Between Gold Nanoparticle and Capping 2-Naphthalenethiol and Organic Memory Cells", Applied Physics Letters, 86, 2005, pp. 123507-1 to 123507-3.

Scheinert, S. et al., J. Appl. Phys., 92 330 (2002).

Chiang, J.C., et al., Synth. Met. 13, 193, (1986). "Polyaniline: Protonic acid doping of the emeraldine form to the metallic regime.".

Huang, J., et al., J. Am. Chem. Soc. 25, 314 (2003) "Polianiline Nanofibers: Facile Synthesis and Chemical Sensors".

Virji, S., et al. Nano Lett., 4, 491 (2004). "Pollyaniline Nanofiber Gas Sensors: Examiner of Response Mechanisms".

Huang, J., et al., J. Am. Chem. Soc., 126, 851 (2004). "A General Chemical Route to Polyaniline Nanofibers".

Furukawa, T., Adv. Colloid Interface Sci., 71-72, 183 (1997). "Structure and functional properties of ferroelectric polymer".

Tsuyoshi, T., et al., App. Phys. Lett., 83, 4978 (2003). "Electrical carrier-injection and transoprt characteristics of photochromic diarylethene films".

Reed, M.A., et al., Appl. Phys. Lett., 78, 3735 (2001). "Molecular random access memory cell".

Chen, Y., et al, Appl. Phys. Lett. 82, 1610 (2003). "Nanoscale molecular-switch devices fabricated by imprint lithography".

Tang, C.W. et al., "Organic Electroluminescent Diodes", Appl. Phys. Lett 51 (12), Sep. 21, 1987, p. 913-915.

Friend, R.H. et al., "Electroluminescence in Conjugated Polymers", Nature, vol. 397, Jan. 14, 1999, p. 121-128.

Sariciftci, N.S. et al., "Photoinduced Electron Transfer from a Conducting Polymer to Buckminsterfullerence", Science, vol. 258, Nov. 27, 1992, p. 1474-1476.

Gundlach, D.J. et al., "Pentacene Organic Thin-Film Transistors,-Molecular Ordering and Mobility", IEEE Electron Device Letters, vol. 18, No. 3, Mar. 1977, p. 87-89.

Baldo, Marc et al., "Organic Vapor Phase Deposition", Adv. Mater. 1998, 10, No. 18, p. 1505-1514.

Carchano, H. et al., "Bistable Electrical Switching in Polymer Thin Films", Applied Physics Letters, vol. 19, No. 19, Nov. 15, 1971, p. 414-415.

Xu, W. et al., "Two New All-Organic Complexes with Electrical Bistable States", Appl. Phys. Lett. 67 (15), Oct . 9, 1995, p. 2241-2242.

Ma, L.P. et al., "Data Storage with 0.7 nm Recording Marks on a Crystalline Organic Thin Film by a Scanning Tunneling Microscope", Applied Physics Letters, vol. 73, No. 6, Aug. 10, 1998, p. 850-852.

Henisch, H.K. et al., "Switching in Organic Polymer Films" Applied Physics Letters, vol. 24, No. 12, Jun, 15, 1974, p. 589-591.

Bryce, Martin R., "Tetrathiafulvalenes as π-Electron Donors for Intmolecular Charge-Transfer Materials", Advanced Materials, 1999, 11, No. 1, p. 11-23.

Martin, Nazario et al., "Evidence for Two Separate One-electron Transfer Events in Excited Fulleropyrrolidine Dyads Containing Tetrathiafulvalene (TTF)", J. Phys. Chem. A 2000, 104, p. 4648-4657.

* cited by examiner (a)

(b)

THREE-TERMINAL ELECTRICAL BISTABLE DEVICES

CROSS-REFERENCE TO RELATED APPLICATION

This application claims priority to International Application No. PCT/US2004/040368, filed Dec. 1, 2004 and U.S. Provisional Application No. 60/527,041, filed Dec. 3, 2003, the entire contents of which are incorporated herein by reference.

This invention was made with support of Government Grant No. F49620-01-1-0427, awarded by AFOSR. The U.S. Government has certain rights in this invention.

BACKGROUND OF THE INVENTION

1. Field of the Invention

The present invention relates generally to electronic memory cells and switches. More particularly, the present invention involves three-terminal electronic memory and switching devices that utilize two organic memory cells or switching elements that exhibit electrical bistable behavior.

2. Description of Related Art

The publications and other reference materials referred to herein to describe the background of the invention and to provide additional details regarding its practice are hereby incorporated by reference. For convenience, the reference materials are numerically referenced and identified in the appended bibliography.

Devices with electrical bistability have been widely studied because they can be used as switches and memory elements, which are important for digital electrical instruments since they have two states of different conductivity. The reversible resistance switching process that occurs in inorganic thin films has engendered strong interest and much work has been done in this field. Recently, organic electrical switching and memory devices have attracted more attention because of the distinct advantages of organic materials, such as light weight, mechanical flexibility, etc. (1-11).

Organic bistable devices (OBD) and their electrical switching and memory effect have previously been reported (5-8). These devices include five thin films that form an organic/metal-nanocluster/organic triple layer that is sandwiched between two electrodes. When the voltage on the device is larger than a critical voltage, the device switches from a high impedance state (OFF state) to a low impedance state (ON state) and remains in the ON state until a negative voltage is applied. Recently, it was found that the metal-nanocluster layer can be formed by co-evaporation of metal and organic materials, instead of simply depositing the metal at slow deposition rate (8). We found that the devices fabricated in this way are highly reproducible. For convenience, in this specification we sometimes refer to the (middle) mixed layer as the metal-nanocluster layer.

Most memory devices based on conductance change are detected by measuring the device current. From application point of view, the memory cell should be as small as possible, such as in the micrometer or sub-micrometer scale, in order to achieve a high density of data storage. In this case, the current through the memory cell may be too small to be distinguished conveniently to determine whether the device is in ON state or OFF state. This issue may be overcome by increasing the ON state current of the device.

SUMMARY OF THE INVENTION

In accordance with the present invention, we provide another approach to solve the issues set forth above by demonstrating a three-terminal OBD (3-T OBD), which is realized by wiring-out the metal-nanocluster layer of the OBD as the middle electrode. The ON and OFF state of the device can be read out by measuring the potential of the third terminal of a biased device, which is independent of the device area.

In accordance with the present invention, electrical bistable devices are provided that are convertible between low resistance (impedance) states and high resistance (impedance) states. The electrical bistable devices are well suited for use as electrical switching and memory devices. The electrical bistable devices of the present invention include a tri-layer that is composed of a mixed layer of a high conductivity material and low conductivity organic material that is sandwiched between layers of low conductivity organic material. The tri-layer is sandwiched between two electrodes. The two electrodes and the mixed layer are connected to three terminals to provide for switching of the device between various low resistance states and high resistance states by application of suitable electrical voltages between the terminals. The three-terminal configuration allows one to switch the device between up to four different high and low resistance states.

As a feature of the present invention, the mixed layer is composed of a low conductivity organic material and a sufficient amount of a high conductivity material to render the mixed layer electrically conductive. The mixed layer includes a first side and a second side. The first layer of low conductivity organic material is located on the first side of the tri-layer. A first interface is formed where the first layer of low conductivity organic material and mixed layer meet. The first layer of low conductivity organic material includes a first electrode side that is located opposite the first interface. A second layer of low conductivity organic material is located on the second side of the mixed layer and forms a second interface where the second layer and mixed layer meet. The second layer of low conductivity organic material includes a second electrode side that is located opposite the second interface. A first electrode is attached to the first electrode side of the first layer of low conductivity organic material and a second electrode is attached to the second electrode side of the second layer of low conductivity organic material.

The high conductivity material used to form the mixed layer can be a metal, conductive oxide, conducting polymer or organic conductor. The low conductivity organic material used in forming the mixed layer can be an organic semiconductor or organic insulator. The low conductivity material and the high conductivity material are mixed together in amounts to provide a layer that is electrically conductive. However, as a feature of the invention, the interfaces between the layers of low conductivity organic material and the electrically conductive mixed layer exhibit electrical bistable behavior. Therefore, each unit cell of the dual-memory cell has one interface to the nanocluster and can behave as one individual memory cell.

The electrical bistable devices may be used to form a wide variety of memory devices and switches wherein a memory input element is provided for applying voltage to the bistable interfaces to convert the bistable interfaces between low electrical resistance states and high electrical resistance states.

Memory devices may further include a memory read-out element, which provides an indication of whether the bistable interfaces are in the low or high electrical resistance states.

As one feature of the present invention, the memory input element includes a terminal (T1) attached to the first electrode (bottom electrode), a terminal (T3) attached to the middle mixed layer (middle electrode) and a terminal (T2) attached to the second electrode (top electrode). The portion between the bottom electrode (T1) and middle electrode (T3) is defined as the bottom part of the 3-T OBD, and the portion between middle electrode (T3) and top electrode (T2) is defined as top part of the 3-T OBD. It was discovered that application of an appropriate voltage between the bottom electrode (T1) and the middle electrode (T3) provided conversion in electrical resistance of that bottom part of the 3-T OBD Likewise, when an appropriate voltage was applied between the top electrode (T2) and the middle electrode (T3), the electrical resistance of the top part of the 3-T OBD was also converted. This particular feature allows the device to be switched between four possible states by applying voltage pulses between the two pairs of terminals (T1-T3 and T2-T3). This type of a device may be used to provide double data storage density.

When the top part (top-electrode/top-organic/metal-nanocluster) and the bottom part (metal-nanocluster/organic/bottom-electrode) are not electrically the same, caused by interface formation, the potential difference of the middle electrode can be detected for a biased device (less than switching voltage) between the ON state and the OFF state. The 3-T OBDs can be read out by measuring the potential of the middle electrode, which is independent of device area. Hence the reading of 3-OBDs is still effective as the memory cell shrinks to micro or sub-micro scale. It was also found that the electrical contact between the top electrode/top organic layer and the bottom organic layer/bottom electrode is different which causes the two parts of the 3-terminal OBDs to be electrically asymmetric, with the result being a large increase of the potential of the middle electrode during switching ON process.

The above discussed and many other features and attendant advantages of the present invention will become better understood by reference to the following detailed description when taken in conjunction with the accompanying drawings.

BRIEF DESCRIPTION OF THE DRAWINGS

FIG. 7a is the beginning of the cyclic test while FIG. 7b is that recorded after 21 hours of continual testing.

DETAILED DESCRIPTION OF THE INVENTION

Figure 1:
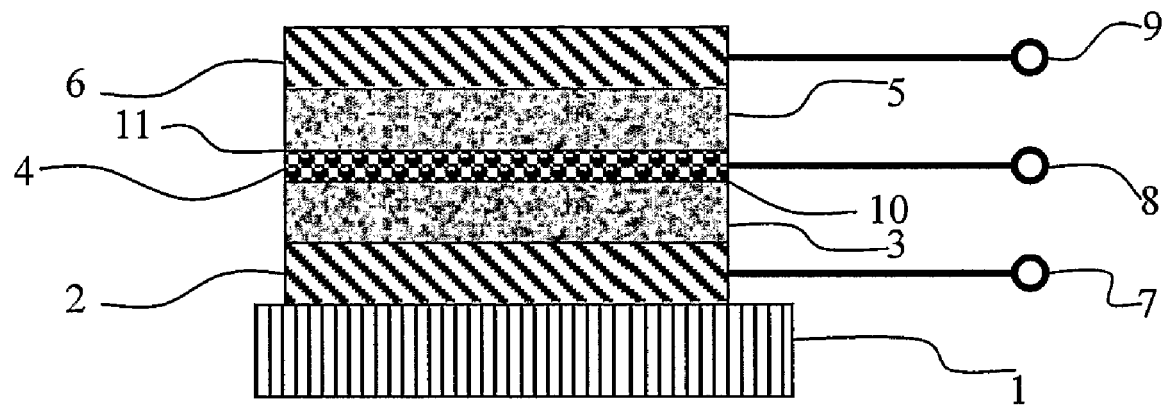
FIG. 1(a) is a diagram of a three-terminal electrical bistable device (3-T OBD) in accordance with the present invention showing a co-evaporated middle layer and the measurement setup.
FIG. 1(b) depicts the chemical structure of AIDCN.
Figure 1:
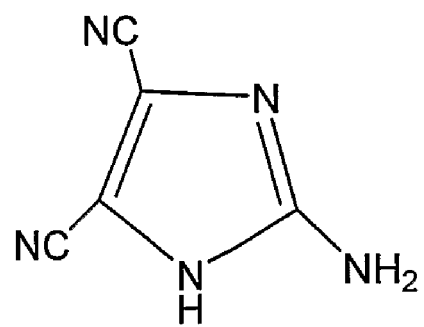

The present invention is an improvement over the high-performance organic or electrical bistable devices that utilize an organic/metal/organic configuration as the bistable structure which is sandwiched between two aluminum electrodes (5,6). The present invention is also an improvement over organic or electric bistable devices where the tri-layer is composed of metal nanoclusters separated by thin oxide layers (8).

In accordance with the present invention, electrical bistable devices are provided that may be used as a three-terminal organic memory or switching device. The devices have a basic structure where a triple layer (organic layer/mixed layer (metal:organic)/organic layer) is sandwiched between two electrodes. The two electrodes and the wired-out mixed (metal:organic) layer are the three terminals of the device. When the applied voltage on the device is larger than a critical voltage, the device switches from a high impedance state (OFF state) to a low impedance state (ON state) and remains in the ON state until a negative voltage is applied. When the device is biased between the two electrodes, the voltage is observed between the middle mixed layer and the electrodes. We found that for some 3-T OBDs, the potential drop of the top part and the bottom part are not equal. We found that most of the voltage biased on the device drops on the bottom part of the 3-T OBDs, especially when the device is in the OFF state. We further found that the potential drop across the top part of the 3-T OBDs increases dramatically when the device switches from the OFF state to the ON state. Consequently, the state (ON/OFF) can be known from the potential drop across the top part when the device is biased between the top and bottom electrode.

A 3-terminal organic electrical bistable device (3-T OBD) in accordance with the present invention is shown generally in FIG. 1(a). The 3-T OBD that was fabricated on an insulating substrate 1, includes a mixed middle layer (electrically conductive) 4 that is sandwiched between a first (top) layer of low conductivity organic material 5 and a second (bottom) layer of low conductivity organic material 3. The mixed middle layer 4 is shown in the form of a layer. However, it will be understood that the mixed middle layer can be provided in any number of different shapes. Mixed middle layers in the form of a thin layer or film are preferred since fabrication techniques for forming thin films are well known. The 3-T OBD further includes a first (top) electrode 6 and a second (bottom) electrode 2.

The 3-T OBD includes interfaces 10 and 11 located between the mixed middle layer 4 and the organic layers 3 and 5, respectively. The interfaces 10 and 11 exhibit contact resistance that can be changed by charges stored at the interfaces. The 3-T OBD is connected to an electronic control unit (not shown) via electrical terminals 7, 8 and 9. The control unit is capable of providing an electrical voltage bias across any two pair of electrodes 2, 4 and 6 to convert both of the bistable interfaces between low resistance and high resistance states or to convert just one of the interfaces between low resistance and high resistance states. In addition, the control unit is capable of, among other things, measuring the potential of the middle electrode 8 or current to determine the electrical resistance of the device.

As shown in FIG. 1(a) the terminals 7, 8, and 9 may be used to apply a voltage bias ($V_{bias}$) across the entire tri-layer to a grounded electrode 6 with the voltage being measured ($V_{meas}$) at terminal 8. Alternately, the connections 7, 8 and 9 may be used as terminals T1, T3 and T2, respectively. In this exemplary configuration, bias voltages may be applied between T1-T3 and T2-T3, which allows one to individually convert the bottom part (2,3,4) and the top part (4,5,6) of the 3-T OBDs between the high and low resistance states.

The mixed middle layer 4 includes a low conductivity organic material and an amount of high conductivity material that renders the mixed layer electrically conductive. The incorporation of the high conductivity material into the low conductivity organic material can be accomplished in a number of different ways. The two materials are preferably co-evaporated to form a molecular solution where the mixed layer does not have distinct phases or where there are nanoparticles of high conductivity material dispersed throughout the low conductivity organic material. The amount of low conductivity organic material and high conductivity material are also chosen such that an electrically bistable interface is formed when the mixed layer is formed on a layer of low conductivity organic material or where a layer of low conductivity organic material is formed on the mixed layer.

Suitable high conductivity materials include metals, such as aluminum, copper and silver. Other suitable metals can be high work function metals such as gold, nickel and middle work function metals such as magnesium and indium. Low work function metals may also be used such as calcium and lithium. Metal alloys of the above metals (e.g., lithium/aluminum alloys) may also be used as the high conductivity material. Conductive oxides such as metal oxides are also suitable. Conducting polymers such as 3,4-polyethylene-dioxy-thiophenepolystyrene-sulfonate (PEDOT) or doped polyaniline are also suitable high conductivity material. Organic conductors such as buckminster fullerene may also be used as the high conductivity material.

Suitable low conductivity organic materials include organic semiconductors and organic insulators. Exemplary organic semiconductors include small molecular organic materials such as 2-amino-4,5-imidazoledicarbonitrile (AIDCN); tris-8-(hydroxyquinoline)aluminum (Alq); 7,7,8,8-tetracyanoquinodimethane (TCNQ); 3-amino-5-hydroxypyrazole (AHP). Oligomers such as polyanaline may also be used. Organic insulators include polymers such as polystyrene (PS), polycarbonate (PC), polymethylmethacrylate (PMMA), polyolefines, polyesters, polyamides, polyimides, polyurethanes, polyacetals, polysilicones and polysulfonates. In addition semiconducting polymers may be utilized. Exemplary semiconducting polymers include poly (phenylene vinylene) (PPV), polyfluorene (PF), polythiophene (PT), poly(paraphenylene) (PPP) and their derivatives as well as copolymers. The same low conductivity organic materials that are used in forming the mixed layer 12 may also be used to make the layers 14 and 16.

If desired, the above low conductivity (insulating) polymers may be doped with selective dopants such as charge blocking or trapping material, electron and hole transport material, and luminescent material. Charge blocking material include 2,9-dimethyl-4,7-diphenyl-1,10-phenanthroline (Bathocuproine, or B CP); electron transporting materials include tris-(8-hydroxyquinolinolato) aluminum (Alq3) and its derivatives, such as tris-(4-methyl-8-hydroxyquinolinolato) aluminum (Almq3); hole transporting materials include N,N-diphenyl-N,N-bis(3-methylphenyl)-1,1-diphenyl-4,4 diamine (TPD) and N,N-diphenyl-N,N-bis(1-naphthylphenryl)-1,1-diphenyl-4,4 diamine (NPB); luminescent material include 4,4-N,N-dicarbazole-biphenyl (CBP). With regards to the electrodes 15 and 17, conventional electrode material such as aluminum, copper, and other electrode metals, including alloys, may be used. Conducting metal oxides, such as indium tin oxide (ITO), indium oxide and other metal oxides are also suitable electrode material. In addition, conducting polymers such as PEDOT and doped polyanaline may be used.

The high conductivity material and low conductivity organic material may be combined in numerous different ways to form mixed layers in accordance with the present invention that are electrically conductive and which form interfaces with layers of low conductivity organic material that exhibit a reversible transition between high and low electrical resistance states (bistable behavior). For example, the two materials may be co-evaporated to form a single phase mixed layer or a mixed layer in which nanoparticles of high conductivity material are dispersed in the low conductivity organic material. Such deposition procedures are known. The amounts of low conductivity and high conductivity material may be varied to achieve the desired electrical conductivity in the body of the mixed layer and bistable behavior at the interfaces with the layers of low conductivity organic materials. A 1:4 volume ratio of low conductivity to high conductivity material is preferred. However, the volume ratio of low conductivity to high conductivity material may be varied depending upon the particular materials being used and provided that the mixed layer is electrically conductive and also forms electrically bistable interfaces with low conductivity organic materials.

As mention above, the mixed layer may be in the form of a two-phase system where nanoparticles or molecular clusters of high conductivity material are dispersed throughout the low conductivity material. The nanoparticles and molecular clusters preferably have an average particle size of between 1 to 50 nm. The formation of such mixed layers may be accomplished using conventional evaporation techniques known in the electronic fabrication art for forming thin layers containing nanoparticles dispersed in a solid matrix.

Examples of practice are as follows:

The devices of the present invention can be made using fabrication processes that are similar to what has been previously reported (5,6). A glass substrate (See FIG. 1) is cleaned using a routine procedure. First, the pre-cleaned glass substrate is sonicated in detergent, followed by sonication in deionized water, sonication in acetone and then sonication in isopropanol. The cleaned glass substrate is then baked in an oven at about 80° C. to prepare for fabrication. The five layers of the 3-T OBD are deposited layer by layer by thermal evaporation at high vacuum (pressure of the evaporator is below $2.0\times10^{-6}$ Torr) without breaking the vacuum.

The low conductivity organic material and the high conductivity metal material used in this example were 2-amino-4,5-imidazoledicarbonitrile (AIDCN) and aluminum (Al), respectively. First, a 650 Å Al film was deposited on the cleaned glass substrate at a deposition rate of 3 Å/s to form the bottom or second electrode (17). Then, a 400 Å thick film of AIDCN was deposited (0.5 Å/s) to form the bottom organic layer (16). Then, a mixed layer 12 composed of Al and AIDCN was deposited by co-evaporation. The bistable layer 12 was 200 Å thick. The deposition rate of Al and AIDCN for the middle bistable layer 12 was 0.4 Å/s and 0.1 Å/s, respectively. Then, another 450 Å thick film of AIDCN was deposited at a rate of 0.5 Å/s to form the upper organic layer 14. Finally, an 800 Å thick film of Al was deposited at a rate of 2 Å/s to form the top or first electrode 15. The cross-sectional area of the top and bottom electrodes 17 and 15 was 0.4 mm$^2$, which is the size of 3-T OBD's set forth in this example.

In order to study the mechanism of 3-T OBD's and investigate the potential distribution of the device, we wired out the middle layer 4 during device fabrication. When the mixed middle layer 4 was deposited on the bottom AIDCN layer 3, it was also deposited on an extra bottom electrode for wiring it out and a strip of the mixed film was deposited on the glass substrate at the same time for study of the mixed film itself.

The thicknesses of the thermally evaporated organic and metal thin films were monitored by a quartz crystal calibrated with Dektak IIA. Current-voltage curves reported here were measured with a HP 4155B semiconductor parameter analyzer. The curves of the cyclic write-read-erase-read test and stress test were characterized by two Keithley 2400 Series Sourcemeters (one for biasing the voltage, another one for measuring the potential drop) that were controlled by a computer. All electrical measurements were done in ambient condition.

Figure 2:
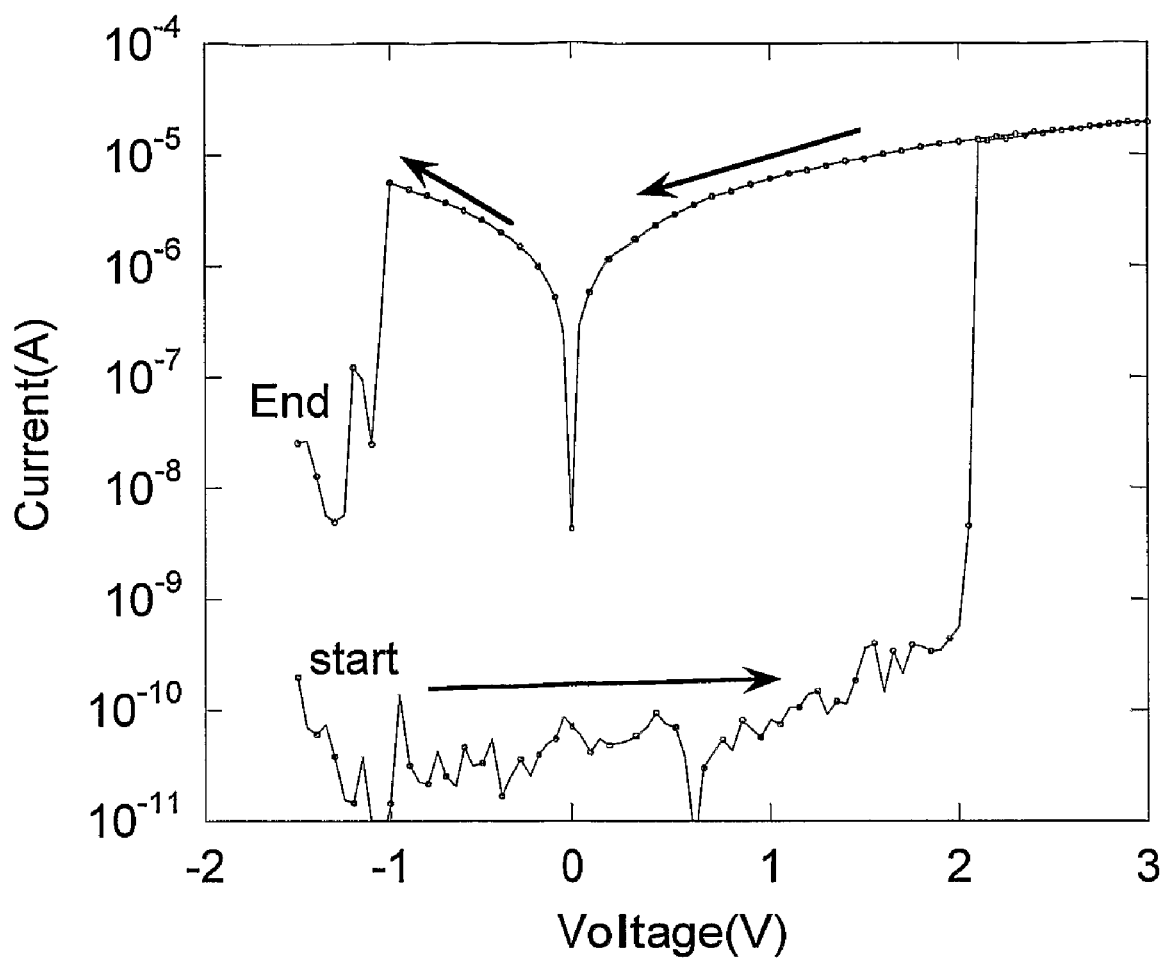
FIG. 2 is a graph showing current (I)-voltage (V) characteristics of an exemplary 3-T OBD in accordance with the present invention recorded during the switching on process and the ON state measured through top and bottom electrode.

Typical I-V curves for a 3-T OBD are shown in FIG. 2. During the first forward bias scan from −1.5 to 3 volts, the device shows a very low current in the low-voltage range, indicating the device is in the OFF state. At a critical voltage (it is 2 volts here), the current has a sharp increase of several orders of magnitude, indicating the device has had a transition from the OFF state to the ON state. However, the I-V curve recorded in the second bias scan is totally different from that observed in the first bias scan. Even in the low-voltage range, the device shows a very high current, indicating that the device remains in the ON state. When the device is switched to the ON state, it remains in that state even when the power is off. The OFF state can be recovered by applying a reverse bias, which means that this kind of device is ideal for memory applications.

When we measured the I-V curves of the exemplary 3-T OBD, a sweeping voltage was biased between the top Al electrode 9 and bottom Al electrode 2 and the change in potential of the middle mixed layer 4 was observed at same time. The I-V curves and the changing potential drop on the top part (4,5,6) ($U_{top}$) and the bottom part (2,3,4) ($U_{bottom}$) during the switch-on process of a device are shown in FIG. 3.

Figure 3:
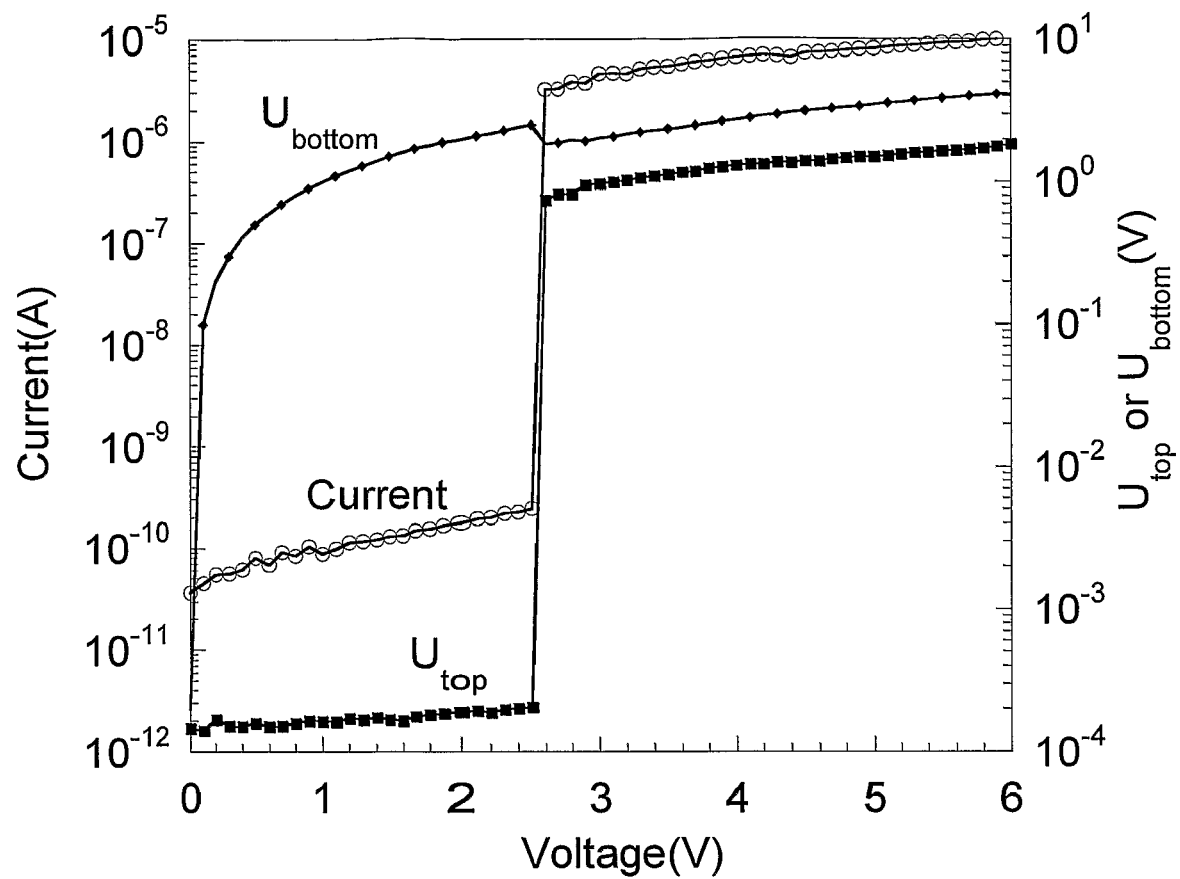
FIG. 3 is the bias dependence of the potential drops on the top part (top-electrode/top-organic/mixed-layer) ($U_{top}$) and the bottom part (mixed-layer/bottom-organic/bottom-electrode) ($U_{bottom}$) of a three-terminal OBD (left Y-axis) and the device current (right Y axis).

In FIG. 3, the common electrode for biasing and measurement is the top Al electrode 6, so the potential measured is the voltage drop across the top part (4,5,6) (defined as $U_{top}$). $U_{top}$ increases from 0.2 mV to 1 V when the device transitions from the OFF state to the ON state at around 2.5 volts. The potential drop of the bottom part (2,3,4) (defined as $U_{bottom}$) can be obtained by subtracting $U_{top}$ from the biased voltage. $U_{bottom}$ changes very smoothly while sweeping the voltage, but decreases slightly more when the device switches from the OFF state to the ON state. When the device in the OFF state, almost all of the voltage on the device drops on the bottom part (2,3,4) In the ON state, the values of $U_{top}$ and $U_{bot}$ are of the same order and comparable.

To further confirm this point, the common electrode was also selected for the bottom Al electrode 2 during the measurement. A similar result was also observed.

Figure 4:
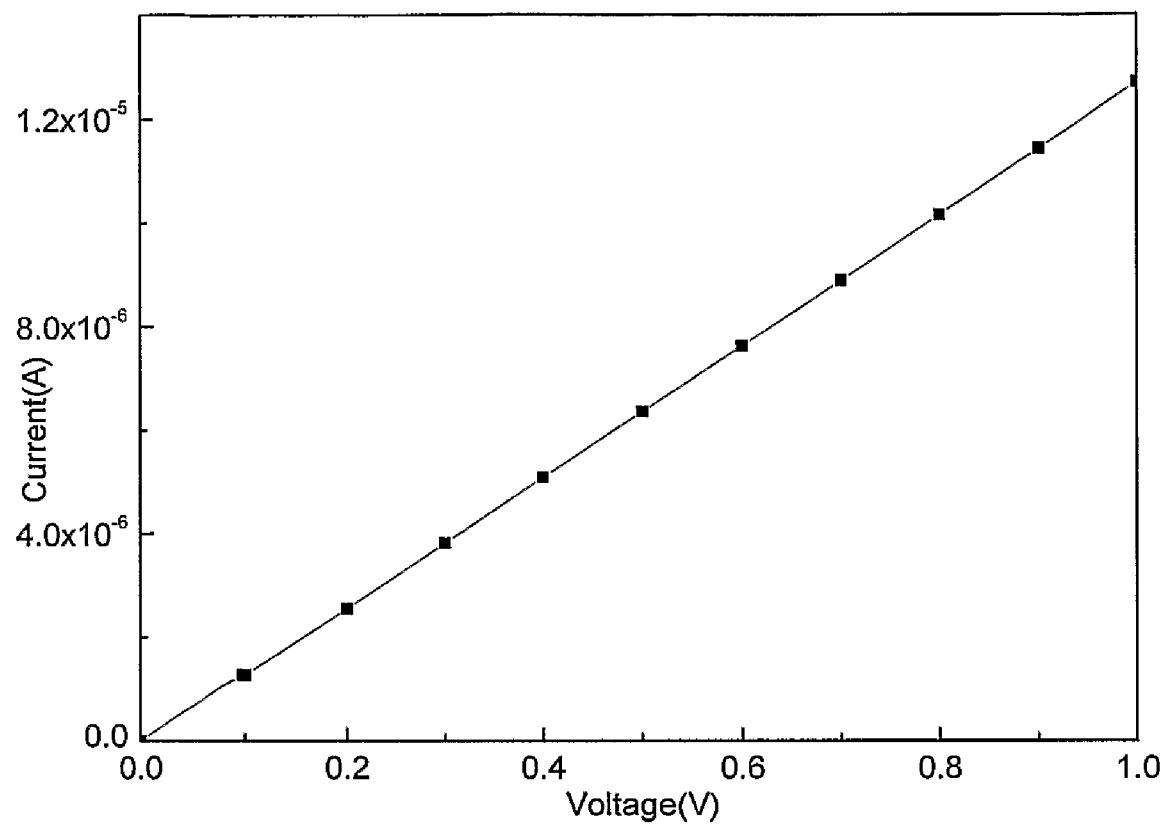
FIG. 4 is a graph showing the typical I-V characteristics of a strip of mixed layer material measured at the two ends of the strip in accordance with the present invention where the mixed middle thin film has a size of 10 mm by 3 mm and thickness of 200 Å.

The I-V curve of the middle mixed layer alone on a glass substrate is shown in FIG. 4. The size of the thin film or layer is 10 mm by 3 mm. The layer was deposited on glass when the mixed middle layer 4 was deposited on the bottom AIDCN film 3 during fabrication of the exemplary device. The thickness of the isolated mixed layer was also 200 Å. The I-V curve in FIG. 4 is a perfect straight line, which means the middle mixed layer shows ohmic behavior. The resistance of the layer is about 79 KΩ. From this, we can see that the conductivity of the mixed middle layer 4 is quite large, the potential measured by wiring out the middle layer is reliable and the potential drop on the mixed middle layer 4 can be ignored.

Figure 5A:
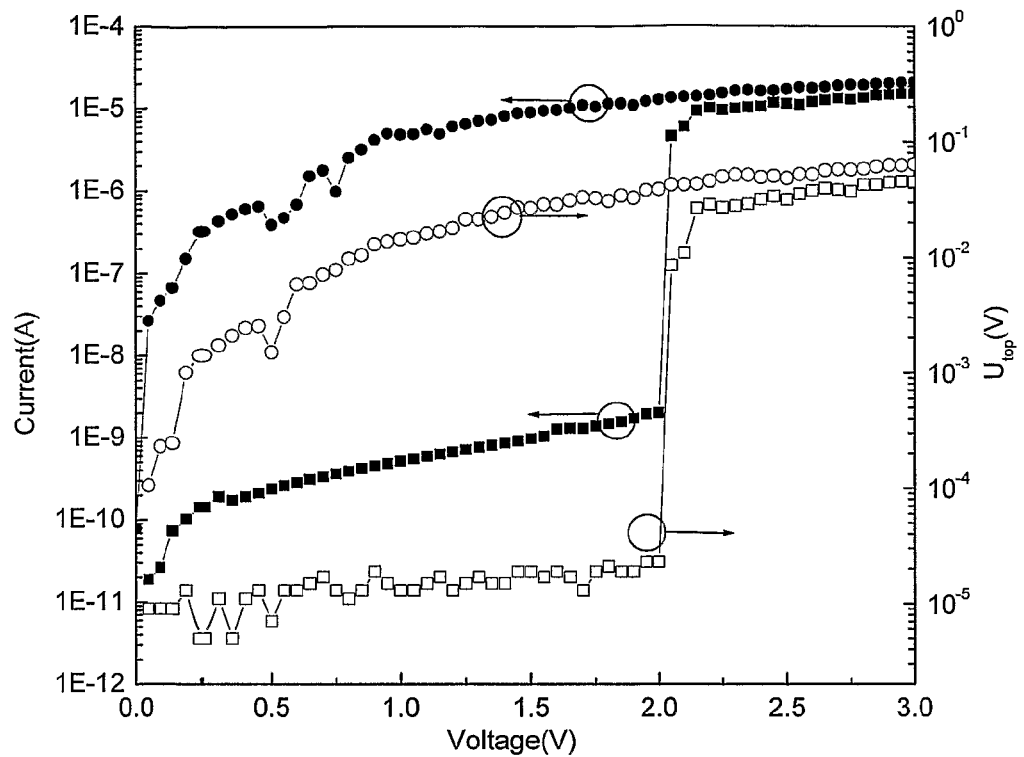
FIG. 5a is a graph showing the I-V curve of an exemplary 3-T OBD in accordance with the present invention and the potential drop of the top part of the 3-T OBD ($U_{top}$) during sweeping from 0 to 3 volts during the switch-on process and in the ON state.

FIG. 5 shows the current through the 3-T OBD, $U_{top}$ and the resistance of the top part (4,5,6) and bottom part (2,3,4) during the switch-on process and the ON state. In FIG. 5a, during the first sweep (squares), the current through the 3-T OBD and the potential drop of the top part (4,5,6) sharply increase three orders at the same time when the sweeping voltage increases to 2 volts and the 3-T OBD is switched on. During the second sweep (circles), the 3-T OBD remains in the ON state and the current and $U_{top}$ are much higher compared to the OFF state. It is clear that the changes in current and $U_{top}$ are synchronous in the OFF and ON state.

Figure 5B:
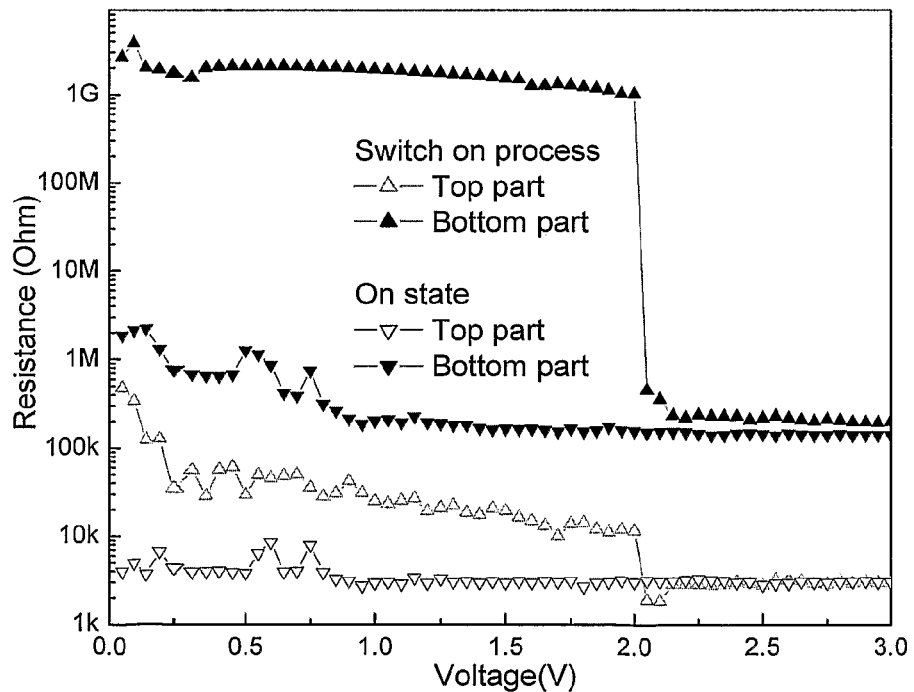
FIG. 5b is a graph showing the change of the resistance of top part and bottom part of the 3-T OBD during the switch-on process and in the ON state.

The resistance of the top part (4,5,6) and bottom part (2,3,4) is obtained by dividing $U_{top}$ and $U_{bot}$ tom by the current. The resistance-voltage curves of the top part (4,5,6) and bottom part (2,3,4) calculated from the data of FIG. 5a are shown in FIG. 5b, where the open curves (open squares and circles) show the resistance change of the top part (4,5,6) and solid curves (solid squares and circles) show the change of the bottom part (2,3,4). From FIG. 5b, one can see that when the 3-T OBD is in the OFF state, the resistance of the bottom part (2,3,4) (defined as $R_{bottom}$) is about 5 orders larger than the resistance of the top part (4,5,6) (defined as $R_{top}$). This is the reason why $U_{top}$ is very small and most of the voltage is dropped at the bottom part (2,3,4) in the OFF state. When the 3-T OBD switches from OFF to ON, both $R_{bottom}$ and $R_{top}$ decrease sharply, but $R_{bottom}$ decreases about 4 orders while $R_{top}$ only decreases 1 order of magnitude. In the ON state, $R_{bot}$ is about 50 times greater than $R_{top}$, so $U_{top}$ increases sharply during the transition of 3-T OBD from the OFF state to the ON state. When the 3-T OBD remains in the ON state, $R_{bottom}$ and $R_{top}$ have no obvious change while sweeping the voltage. From FIG. 5, it is apparent that the decreasing of $R_{bottom}$ plays a more important role for the switching of the 3-T OBD.

Although the thickness of the bottom and top AIDCN layers (3 and 5) is identical, $R_{bottom}$ is much bigger than $R_{top}$ in the ON state and OFF state. The probable reason is that the interfaces of the two AIDCN layers are different. When the mixed middle layer 4 was deposited on the bottom AIDCN layer, a few Al atoms penetrated the bottom AIDCN layer because of the low deposition rate and the co-deposition with AIDCN. As a result, the interface between the bottom AIDCN layer 16 and the mixed middle layer 4 is not clear. When the top electrode 6 was deposited, a lot of Al atoms penetrated in the top AIDCN layer 5 due to the high deposition rate. The morphology of the bottom Al electrode 2 is flatter than the mixed middle layer 4, which is another reason for the uneven potential distribution. The mixed middle layer 4 plays an important role in the 3-T OBD and we believe that the middle mixed layer is "nano-structured" meaning that nanoparticles of Al are dispersed in the AlDCN. The reason for the large decrease of $R_{bottom}$ when the device is switched ON is probably due to charges stored at the nano-particles in the mixed middle layer 4. This results in some charges being induced in the AlDCN layer near the middle and the contact resistance at interfaces 10 and 11 are reduced which results in the device being switched to the ON state.

As is apparent from the above example, a new type of 3-T OBD with three terminals has been created in accordance with the present invention. The top electrode 6, bottom electrode 2 and the electrically conductive mixed middle layer 4 are attached to the three terminals 9, 7 and 8 of the 3-T OBD, which act as ground, control and read terminal, respectively. Top electrode 9 is just the common electrode for biasing and measuring the voltage. The bottom electrode 2 is used to control the state of the 3-T OBD (bias a voltage to switch ON/OFF the device) and bias the small voltage read the state (ON/OFF) of the device, as shown in FIG. 1a. The readout of the three-terminal 3-T OBD is different than the previous two-terminal OBD. A low level voltage (100 mV magnitude in the ON state and below 1 mV in the OFF state) is needed in order to read (measure) the state of the device, while a low level current (1 μA in the ON state and below 10 nA in the OFF state) is needed for the two-terminal OBD. Because a 100 mV voltage is easier to measure than a 1 μA current and the fabrication technology for these two kinds of OBD is the same, the three-terminal OBD in accordance with the present invention is more practical.

Figure 6:
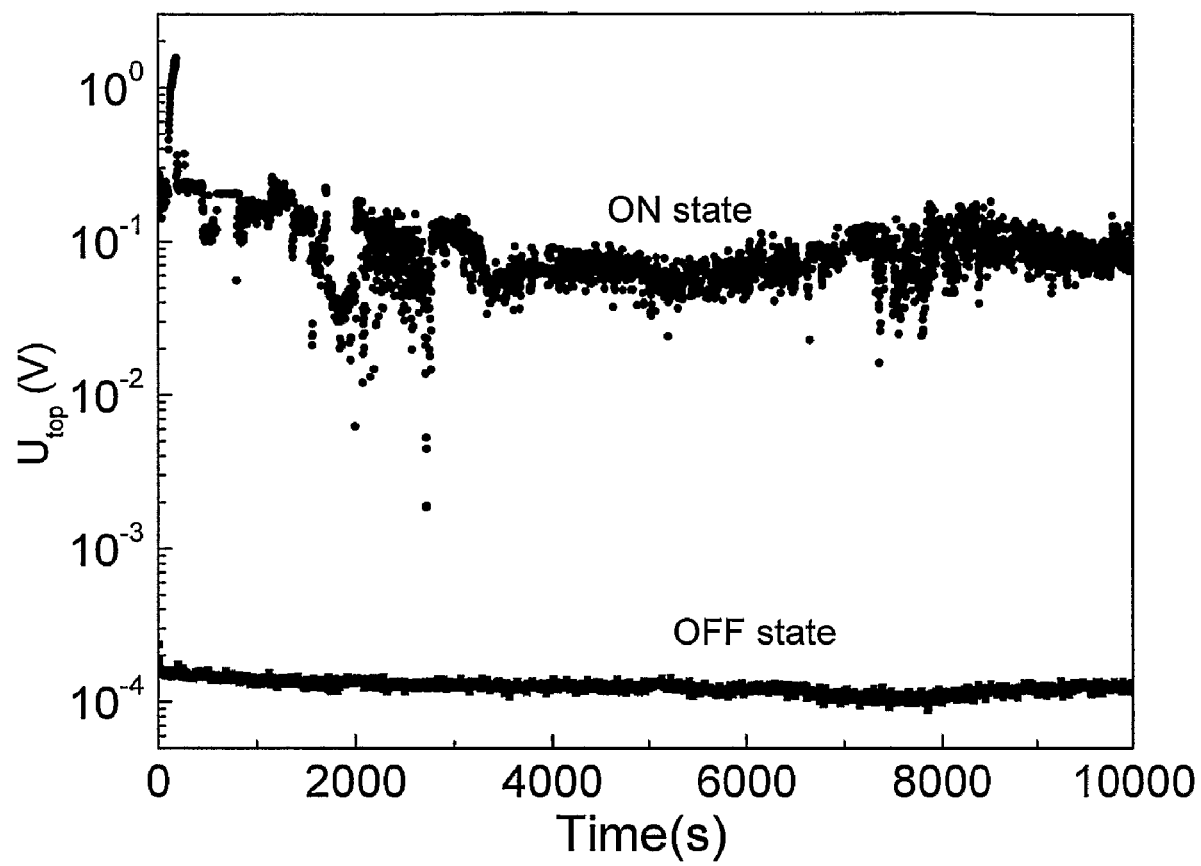
FIG. 6 is a graph showing the results of a stress test of the ON and OFF states of a three-terminal (3-T) OBD in accordance with the present invention that was biased at 1 volt. The device state was read out by measuring the potential drop of the top part of the 3-T OBD ($U_{top}$).

In order to study the stability of the device in the on and OFF state, a constant small voltage is biased on the device. $U_{top}$ is recorded to monitor the state of the 3-T OBD when the 3-T OBD stays in the on or OFF state. FIG. 6 shows the stress test of the ON state and OFF state of the exemplary three-terminal 3-T OBD biased at 1 volt. The inset of FIG. 6 shows the switch-on process and the ON state of the device. The switch-on voltage for this three-terminal 3-T OBD is 2.0 volts. In FIG. 6, $U_{top}$ in the ON state is 3 orders bigger than in the OFF state. It can be seen that there is no significant degradation of the device in either the on or OFF state during the three-hour stress test, which is indicative that both states are stable.

Figure 7A:
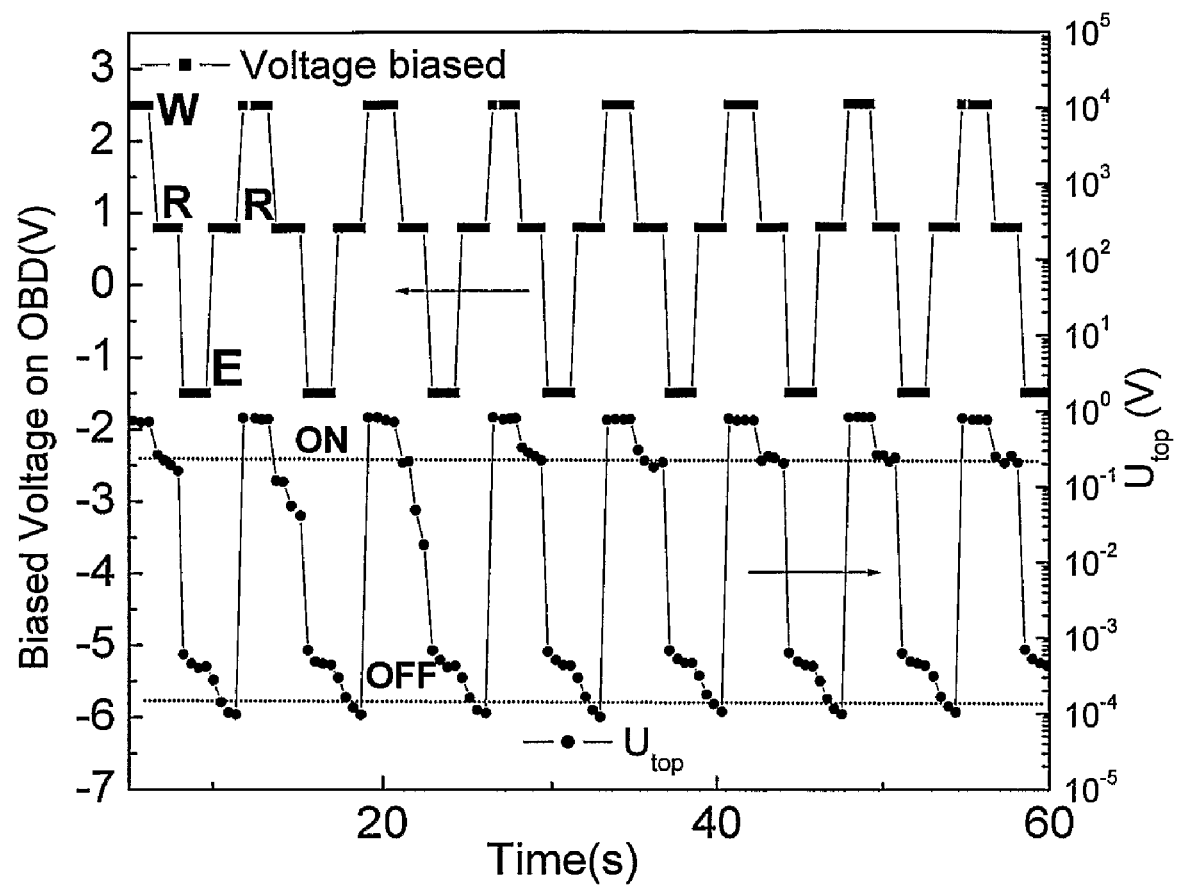
FIGS. 7a and 7b are graphs showing the results of cyclic write-read-erase-read tests of an exemplary three-terminal 3-T OBD in accordance with the present invention. The upper curve is the voltage biased on the device and the bottom curve is the potential drop on the top part of the 3-T OBD. The voltage for write, erase and read is 2.5 volts, −1.5 volts and 1 volt, respectively. In order to use a logarithmic axis for the potential drop across the top part of the 3-T OBD, the current of erasing process is an absolute value.
Figure 7B:
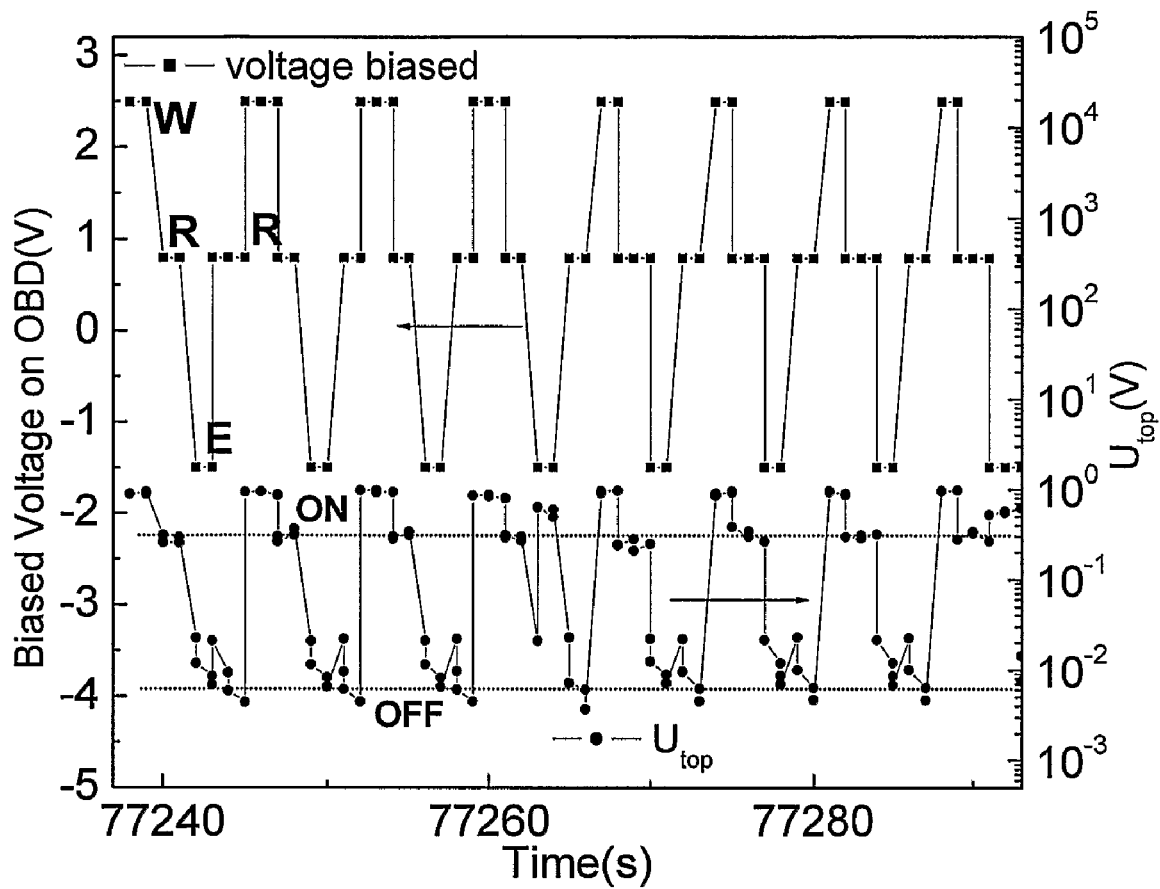

In FIG. 7, we present the rewritable data-storage application of the exemplary three terminal 3-T OBD. The device was biased by a multi-step voltage to: 1) switch on (write): 2) read, switch off (erase); and 3) read it. The voltage for write, erase and read is 2.5 volts, −1.5 volts and 1 volt, respectively. The ratio of $U_{top}$ in the on and OFF state is about $10^3$ during the test. At the beginning, the success ratio of the cycle (write-read-erase-read) is almost 100%. After 21 hours of continual testing, the device still worked very well. The ratio was still near 100%, but $U_{top}$ in the OFF state increased 1.5 orders from 0.1 mV to 10 mV. This indicates that the device degraded during the test since the test was operated in air. It should be noted that the time scale used in FIG. 7 is due to the inherent limitation of the test instrument and program.

The bistable device 10 may also be used to provide double data storage density when the terminals T1, T2 and T3 are connected as set forth in FIG. 1. This terminal configuration sets up two cells (T1-T3) and (T2-T3) in which the interfaces between the mixed layer and layers of low conductivity organic material exhibit electrical bistable characteristics. This means both cells have a 0 state and a 1 state. As a result the bistable device 10 can have 4 different state described by (n,m), where n represents the state of the T1-T3 cell, and m represents the state of T2-T3 cell. The four states are: (0,0), (1,1), (0,1) and (1,0). As is well known, the various states of the device can be controlled by applying voltage pulses between T1-T3 and T2-T3, respectively. This dual cell operation provides for the doubling of the data storage density of the device.

The principle of operation of this type of dual cell device is based at least in part on the interfaces 19 and 21 between the bistable layer 12 and organic layers 14 and 16. For example, if the device is at the (0,0) state, one can apply a writing voltage pulse to the T1-T3 cell. This results in that charge being stored within that portion of the bistable layer at the interface layer 19. Consequently, it causes the T1-T3 cell to be in the ON-state (1). Since no voltage is applied to the T2-T3 cell, the interfacial layer 21 still remains in the OFF-state (0). Because there are barriers between metallic metal-nanoclusters cores, the stored charge within the metal-nanoclusters layer on the interfacial layer or interface 19 remains in place provided no further negative bias is applied to the interfacial layer 19 via the T1-T3 terminals. Hence, the two cells, T1-T3 and T2-T3 can work independently without interference from each other. One can obtain this double data storage density simply by wiring out the bistable device 10 (T1, T2 and T3) as shown in FIG. 1.

As is apparent from the above examples, the potential distribution in the organic bistable device with the organic/metal:organic/organic triple layer structure sandwiched between two electrodes (FIG. 1) is asymmetric. When the device switches from the OFF state to the ON state, the potential drop on the top part (4,5,6) has a sharp jump while the potential drop on the bottom part (2,3,4) has a small change. The reason is that the resistance of the bottom part (2,3,4) decreases several orders when the device is switched on.

Having thus described exemplary embodiments of the present invention, it should be noted by those skilled in the art that the within disclosures are exemplary only and that various other alternatives, adaptations and modifications may be made within the scope of the present invention. Accordingly, the present invention is not limited to the above preferred embodiments and examples, but is only limited by the following claims.

BIBLIOGRAPHY

1. K. Takimoto, H. Kawade, E. Kishi, K. Yano, K, Sakai, K. Hatanaka, K. Eguchi, and T. Nakagiri, Appl. Phys. Lett., 61, 3032 (1992).
2. Yu. G. Kriger, N. F. Yudanov, I. K. Igumenov, and S. B. Vashchenko, J. Struct. Chem. 34,966 (1993).
3. R. S. Potember and T. O. Poehler, Appl. Phys. Lett., 34, 405 (1979).
4. H. J. Gao, K. Sohlberg, Z. Q. Xue, H. Y. Chen, S. M. Hou, L. P. Ma, X. W. Fang, X. W. Fang, S. J. Pang, and S J. Pennycook, Phys. Rew. Lett. 84, 1780 (2000).
5. L. P. Ma, J. Liu and Y. Yang, PCT U.S. Pat. No. 01/17206, U.S. application Ser. No. 10/399,586.
6. L. P. Ma, J. Liu and Y. Yang, Appl. Phys. Lett. 80, 2997 (2002).
7. L. P. Ma, J. Liu, S. Pyo, and Y. Yang, Appl. Phys. Lett. 80, 362 (2002).
8. L. P. Ma, S. M. Pyo, J. Ouyang, Q. Xu and Y. Yang. Appl. Phys. Lett. 82, 1419 (2003).
9. A. Bandyopadhyay and A. J. Pal, Appl. Phys. Lett. 82, 1215 (2003).
10. H. S. Majumdar, A. Bandyopadhyay, A. Bolognesi, and A. J. Pal, J. Appl. Phys. 91, 2433 (2002).

11. D. M. Taylor and C. A. Mills, J. Appl. Phys. 90, 306 (2001).

What is claimed is:

1. An electrical bistable device comprising:
   an electrically conductive mixed layer comprising a first side and a second side, said mixed layer comprising a low conductivity material and a high conductivity material wherein said mixed layer is electrically conductive;
   a first layer of low conductivity material located on said first side of said mixed layer, said first layer of low conductivity material having a first electrode side;
   a second layer of low conductivity material located on said second side of said mixed layer, said second layer of low conductivity material having a second electrode side;
   a first electrode attached to said first layer of low conductivity material at said first electrode side;
   a second electrode attached to said second layer of low conductivity material at said second electrode side;
   a first interface located on the first side of said mixed layer where said first layer of low conductivity material and said mixed layer meet, said first interface being electrically convertible between a stable low resistance state and a stable high resistance state by application of an electrical voltage between the said first electrode and said mixed layer;
   a second interface located on the second side of said mixed layer where said second layer of low conductivity material and said mixed layer meet, said second interface being electrically convertible between a stable low resistance state and a stable high resistance state by application of an electrical voltage between the said second electrode and said mixed layer;
   a first terminal in electrical connection with said first electrode;
   a second terminal in electrical connection with said second electrode; and
   a third terminal in electrical connection with said electrically conductive mixed layer,
   wherein said stable low resistance states and said stable high resistance states persist free from an applied voltage to provide electrical bistability.

2. An electrical bistable device according to claim 1 wherein said low conductivity material is selected from the group consisting of organic semiconductors and organic insulators.

3. An electrical bistable device according to claim 1 wherein said high conductivity material is selected from the group consisting of metals, metal oxides, conducting polymers and organic conductors.

4. An electrical bistable device according to claim 1 wherein said electrically conductive mixed layer is formed by condensing vapors comprising said high conductivity material and said low conductivity material together to form said electrically conductive mixed layer.

5. A method comprising the step of applying an electrical voltage between the first and second electrodes of the bistable device according to claim 1 to convert both said first interface and said second interface between said high resistance state and said low resistance state.

6. A method comprising the step of applying an electrical voltage between the first electrode and the electrically conductive mixed layer of said electrical bistable device according to claim 1 to convert said first interface between said high resistance state and said low resistance state.

7. A method comprising the step of applying an electrical voltage between the second electrode and the electrically conductive mixed layer of said electrical bistable device according to claim 1 to convert said second interface between said high resistance state and said low resistance state.

8. An electrical bistable device according to claim 1, wherein said electrically conductive mixed layer is a two-phase system consisting essentially of electrically conductive nanoparticles dispersed in said low conductivity material.

9. An electrical bistable device according to claim 8, wherein said electrically conductive nanoparticles have an average particle size of at least 1 nm and less than 50 nm.

10. A method for making a bistable device comprising:
    providing a bottom electrode;
    forming a layer of low conductivity organic material on said bottom electrode;
    forming an electrically conductive mixed layer on said layer of low conductivity material, said electrically conductive mixed layer comprising a low conductivity material and a high conductivity material wherein said mixed layer is electrically conductive and wherein an electrically bistable interface is formed between said layer of low conductivity material and said electrically conductive mixed layer;
    forming a second layer of low conductivity material on said electrically conductive layer wherein a second electrically bistable interface is formed between said electrically conductive layer and said second layer of low conductivity material;
    forming a top electrode on said second layer of low conductivity material;
    electrically connecting a first terminal to said first electrode;
    electrically connecting a second terminal to said second electrode; and
    electrically connecting a third terminal to said electrically conductive mixed layer.

11. A method for making an electrical bistable device according to claim 10 wherein said low conductivity material is selected from the group consisting of organic semiconductors and organic insulators.

12. A method for making an electrical bistable device according to claim 10 wherein said high conductivity material is selected from the group consisting of metals, metal oxides, conducting polymers and organic conductors.

13. A method for making an electrical bistable device according to claim 10 wherein said electrically conductive mixed layer is formed by condensing vapors of said high conductivity material and said low conductivity material together to form said electrically conductive mixed layer.

14. A method for making an electrical bistable device according to claim 13, wherein said condensing forms a two-phase system consisting essentially of electrically conductive nanoparticles dispersed in said low conductivity material.

15. A method for an electrical bistable device according to claim 14, wherein said electrically conductive nanoparticles have an average particle size of at least 1 nm and less than 50 nm.

16. A memory device comprising:
    an electrically conductive mixed layer comprising a first side and a second side, said mixed layer comprising a low conductivity material and a high conductivity material wherein said mixed layer is electrically conductive;
    a first layer of low conductivity material located on said first side of said mixed layer, said first layer of low conductivity material having a first electrode side;
    a second layer of low conductivity material located on said second side of said mixed layer, said second layer of low conductivity material having a second electrode side;

a first interface located on the first side of said mixed layer where said first layer of low conductivity material and said mixed layer meet, said first interface being electrically convertible between a stable low resistance state and a stable high resistance state by application of an electrical voltage to said first interface, a second interface located on the second side of said mixed layer where said second layer of low conductivity material and said mixed layer meet, said second interface being electrically convertible between a stable low resistance state and a stable high resistance state by application of an electrical voltage to said second interface;

a first electrode attached to said first layer of low conductivity material at said first electrode side;

a second electrode attached to said second layer of low conductivity material at said second electrode side;

a memory input element in electrical connection to said first electrode, said second electrode and said electrically conductive mixed layer, said memory input element being constructed to selectively convert said first interface and/or said second interface between said stable low electrical resistance state and said stable high electrical resistance state; and a memory readout element in electrical connection with said electrically conductive mixed layer which provides an indication of whether said first interface and/or said second interface is in said stable low electrical resistance state or said stable high electrical resistance state, wherein said stable low resistance states and said stable high resistance states persist free from an applied voltage to provide electrical bistability.

17. A memory device according to claim 16 wherein said low conductivity material is selected from the group consisting of organic semiconductors and organic insulators.

18. A memory device according to claim 16 wherein said high conductivity material is selected from the group consisting of metals, metal oxides, conducting polymers and organic conductors.

19. A memory device according to claim 16 wherein said electrically conductive mixed layer is formed by condensing vapors of said high conductivity and low conductivity materials together to form said electrically conductive mixed layer.

20. A method for operating a memory device according to claim 16 comprising the step of applying a sufficient electrical voltage to said memory input element to convert said first interface and/or said second interface between said high resistance state and said low resistance state.

21. A memory device according to claim 16, wherein, said electrically conductive mixed layer is a two-phase system consisting essentially of electrically conductive nanoparticles dispersed in said low conductivity material.

22. A memory device according to claim 21, wherein said electrically conductive nanoparticles have an average particle size of at least 1 nm and less than 50 nm.

23. A memory device according to claim 16, wherein said memory readout element provides said indication of whether said first interface and/or said second interface is in said low electrical resistance state or said high electrical resistance state based on a voltage measurement.

* * * * *